United States Patent [19]

Sato

[11] Patent Number: 4,640,755

[45] Date of Patent: Feb. 3, 1987

[54] METHOD FOR PRODUCING MAGNETIC MEDIUM

[75] Inventor: Noboru Sato, Kanagawa, Japan

[73] Assignee: Sony Corporation, Tokyo, Japan

[21] Appl. No.: 678,674

[22] Filed: Dec. 6, 1984

[30] Foreign Application Priority Data

Dec. 12, 1983 [JP] Japan ................................ 58-234089
Feb. 10, 1984 [JP] Japan .................................. 59-23883

[51] Int. Cl.$^4$ ............................................. C23C 14/36
[52] U.S. Cl. ................................................. 204/192.2
[58] Field of Search ........................ 204/192 M, 192 C

[56] References Cited

U.S. PATENT DOCUMENTS 3,303,116 2/1967 Maissel et al. ...................... 204/192
4,367,257 1/1983 Arai et al. ............................ 428/220

OTHER PUBLICATIONS

C. T. Burilla et al, Multiple-Target Method for Sputtering Amorphous Films for Bubble-Domain Devices, Am. Inst. Phys. Conference Proceedings, 1976, pp. 340-342.

Primary Examiner—John F. Niebling
Assistant Examiner—William T. Leader

[57] ABSTRACT

A method for producing a magnetic medium which includes the steps of sputtering a magnetic material containing iron onto a substrate in an atmosphere of argon gas mixed with nitrogen gas and depositing a magnetic film on the substrate. The nitrogen is preferably present in an amount of 10 to 10000 ppm and serves to increase the saturation intensity of magnetization. The preferred version of the method consists in jointly sputtering a rare earth metal and an iron-cobalt.

7 Claims, 3 Drawing Figures

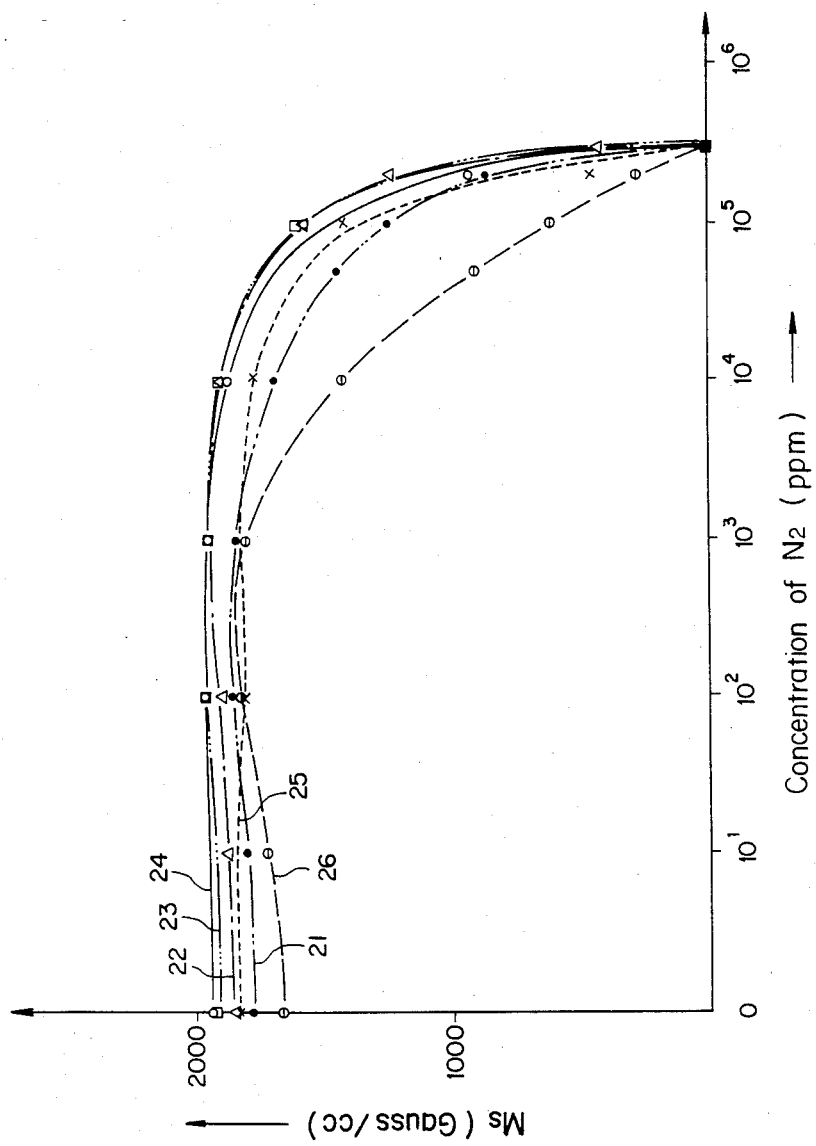

METHOD FOR PRODUCING MAGNETIC MEDIUM

BACKGROUND OF THE INVENTION

1. Field of the Invention

This invention is in the field of producing a magnetic recording medium containing iron, including, for example, a magnetic medium including a composite Tb-FeCo magnetic film or a magnetic film of Fe-Co amorphous alloy which may be used for example as an optomagnetic recording medium, e.g., an optomagnetic disk capable of recording and reproducing by optical irradiation. The invention is also applicable to various magnetic media such as the usual magnetic recording media capable of recording and reproducing with a magnetic head or the like by usual electromagnetic induction.

2. Description of the Prior Art

There has been previously proposed a composite amorphous alloy composed of rare earth metals such as Tb and Gd, etc., and transition metals such as Fe and Co and the like, as an optomagnetic disc capable of writing reading by a laser beam, e.g., a semiconductor laser beam and also capable of being reloadable.

Generally, the method of vacuum evaporation is used as a method for forming the magnetic film for this type of magnetic medium. Specifically, such a vacuum evaporation is adopted from a resistance heating method wherein an evaporation source is heated to be evaporated, an electron beam or ion beam impact method wherein an electron beam or ion beam is impacted against the evaporation source to carry out evaporation, and by a sputtering method.

It is also known that the saturated intensity of magnetization Ms of a magnetic material is increased wherein nitrogen atoms are coupled with Fe, as compared with the case where the magnetic material contains Fe only.

In the magnetic medium such as an optomagnetic recording medium, a minimum diameter (d) of its recording bit is given by the equation d α Ew/(Ms.Hc), wherein Ms is the saturated intensity of magnetization; Hc is the coercive force, and Ew is the magnetic wall energy. According to the equation, when the saturated intensity of magnetization Ms is increased, it is evident that the diameter (d) of an information bit may be reduced, and accordingly high density of the magnetic material may be attained. Therefore, it is desirable that the saturated intensity of magnetization Ms of the magnetic medium be rendered as large as possible.

On the other hand, it is known that the saturated intensity of magnetization Ms is increased in the case that nitrogen atoms are coupled with Fe as the magnetic material, as compared with the case where the magnetic material contains Fe alone. Accordingly, it is known that various magnetic media such as optomagnetic recording media can consist of a magnetic film containing Fe coupled with nitrogen atoms.

SUMMARY OF THE INVENTION

The present invention seeks to provide a method for producing a magnetic medium which may provide more highly saturated intensity of magnetization Ms as compared with the magnetic medium formed of an iron magnetic film coupled with nitrogen atoms and possessing improved stability and repeatability, and which is superior in magnetic characteristics.

According to the present invention, a composite Tb-FeCo magnetic film containing Fe and about 5—30 atomic %, preferably 5-10 atomic % of cobalt or a FeCo magnetic material containing Fe and about 5-50 atomic % of Co is sputtered onto a disk-like or film-like substrate in an atmosphere of argon gas at a pressure of $10^{-2}$ to $10^{-3}$ Torr while admixed with nitrogen at a concentration of 10 to 10000 ppm to form a magnetic film.

As described above, the present invention is characterized in that a magnetic material containing Fe is especially sputtered onto a substrate to form a magnetic film on the substrate and that the sputtering is carried out in an atmosphere of argon gas mixed with nitrogen gas. Thus, the saturated intensity of magnetization Ms may be effectively improved.

In connection with this invention, there are several methods of forming the magnetic film, e.g., a resistance heating method, an electron beam or ion impingement method, and the like. In the case of the resistance heating method and the electron beam impact vacuum evaporation method, the operation is carried out under high vacuum of about $10^{-7}$ Torr. In the case of the ion beam impact method, the operation is carried out under vacuum of about $10^{-5}$ Torr. In contrast, a sputtering method is carried out under a reduced pressure of about $10^{-2}$ to $10^{-3}$ Torr and therefore the particles to be sputtered may be effectively coupled with nitrogen atoms to improve the saturated intensity of magnetization Ms without excessively high vacuum conditions.

In the case where argon (Ar) gas alone is used, the power of sputtering is increased. On the contrary, where nitrogen gas is mixed with Ar gas, the power of sputtering may be reduced because the nitrogen gas is more active than Ar gas. Thus, mixing of nitrogen gas with Ar gas is an advantage in itself. Additionally, the magnetic characteristics with respect to concentration of nitrogen gas are stable as to the alloy $Fe_{95-50}Co_{5-50}$, and accordingly the concentration of nitrogen gas may be selected from the wide range of 10 to 10000 ppm, which is also an advantage industrially.

Other objects and features of the present invention will become apparent from considering the following detailed description in conjunction with the accompanying drawings.

BRIEF DESCRIPTION OF THE DRAWINGS

FIG. 3 is a chart similar to FIG. 2 illustrating a modified embodiment of the present invention.

DESCRIPTION OF THE PREFERRED EMBODIMENTS

Figure 1:
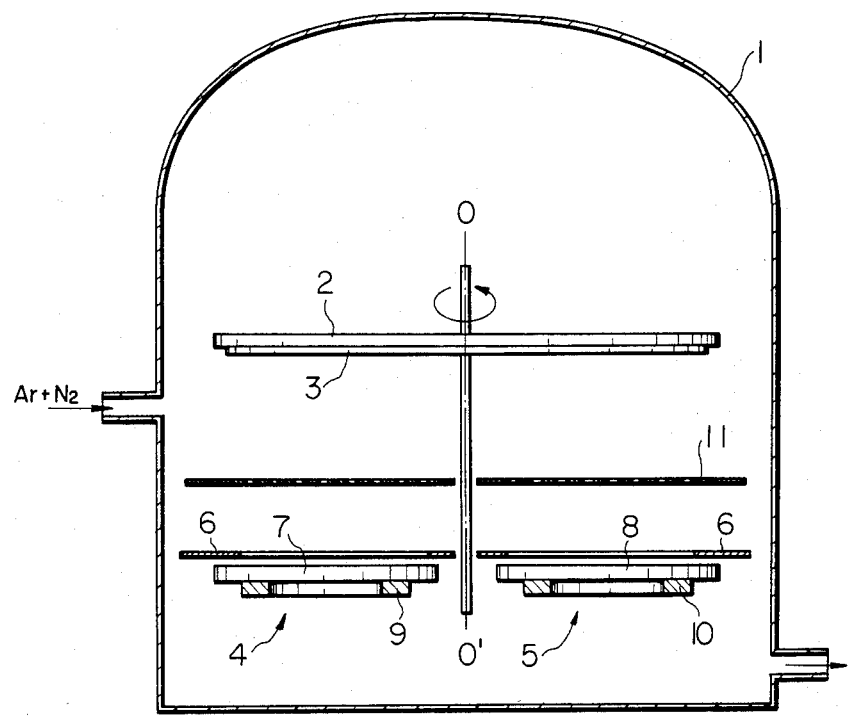
FIG. 1 illustrates rather schematically a sputtering device for carrying out the method of the present invention.

In FIG. 1 there is shown a schematic representation of a sputtering device for carrying out the present invention by way of example. The device includes a bell jar 1 in which there is provided a rotatable base 2 rotatable about a center axis O-O' of the jar 1. A substrate of glass, acrylic resin or polycarbonate resin plate, or the like, constitutes an objective magnetic medium, e.g., optomagnetic recording material is provided on a lower surface of the base 2. Two sputter sources 4 and 5 are arranged on opposite sides to the substrate 3 and spaced from each other at equal angles about the central axis O-O', that is to say, at an angle of 180°. A pair of masks 6 restrict the sputtering position of the metal to be sputtered from the sputter sources 4 and 5 and are positioned between the sputter sources 4 and 5 and the base 2 or the substrate 3. Further, a shutter 11 is provided between the mask 6 and the substrate 3 so as to allow the material as sputtered to the substrate to be stabilized in respect of its deposited condition. The sputter source includes a target 7 formed of a rare earth metal, such as a Tb plate, and the sputter source 5 includes a target 8 formed of an FeCo alloy plate having the aforementioned desired composition, e.g., $Fe_{95-70}Co_{5-30}$ alloy plate containing 5–30 atomic % of cobalt. Magnets 9 and 10 are located below the targets 7 and 8.

After the air in the bell jar 1 is exhausted, argon (Ar) gas mixed with nitrogen gas is fed into the bell jar 1 and the substrate 3 is rotated with the gas mixture continuing to be introduced under a desired pressure. Then, the targets 7 and 8 are used as cathodes to carry out direct current sputtering. Specifically, the Ar atmosphere in the bell jar 1 is adjusted in such a manner that air in the bell jar 1 is exhausted to a vacuum of about $5 \times 10^{-7}$ Torr and then Ar gas containing nitrogen gas in a concentration of 10 to 10,000 ppm is fed into the bell jar 1 under a reduced pressure of about $5 \times 10^{-3}$ Torr.

Figure 2:
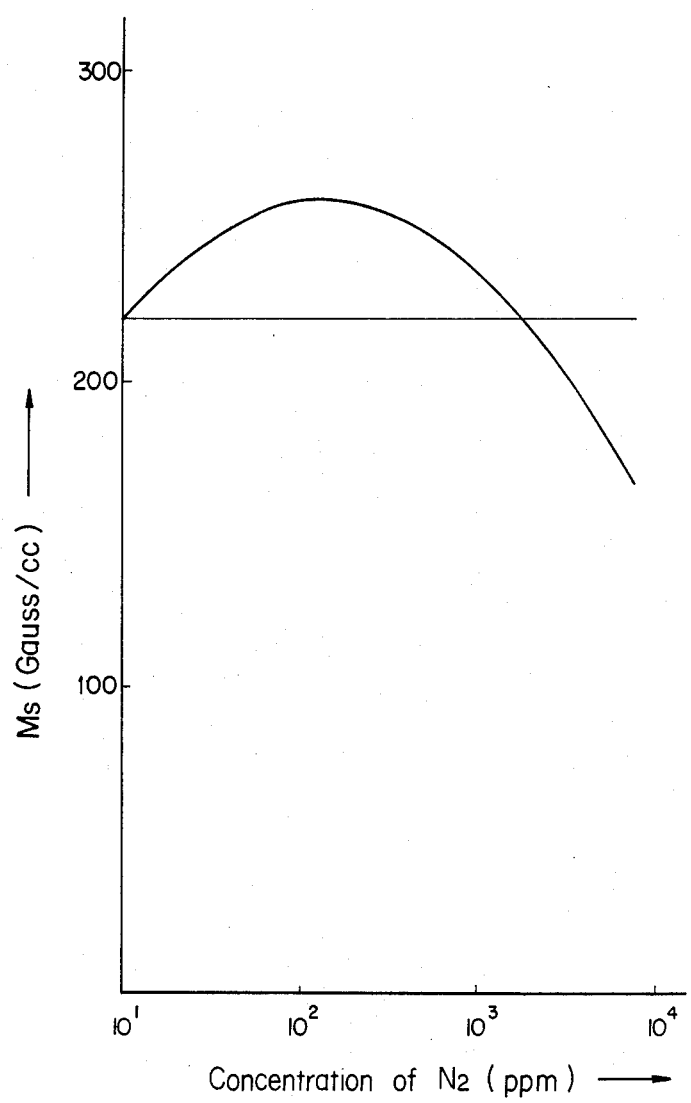
FIG. 2 is a chart plotting intensity of magnetization Ms relative to concentration of nitrogen gas in a sputtering atmosphere according to a preferred embodiment of the present invention.

FIG. 2 shows the results obtained in plotting the saturated intensity of magnetization Ms of a Tb-FeCo magnetic film obtained in the above manner relative to varying concentrations of nitrogen gas in admixture with the Ar gas. As will be apparent from FIG. 2, the saturated intensity of magnetization Ms is increased when the Ar gas is mixed with nitrogen gas in a concentration of 10 to 1000 ppm as compared with the case when the sputtering is carried out in an atmosphere of Ar gas only. In the case that the magnetic film is formed in an atmosphere of Ar gas only, the saturated intensity of magnetization Ms is about 220 Gauss/cc, while in the case of formation in an atmosphere of Ar gas containing nitrogen gas of 150 ppm, the saturated intensity of magnetization Ms is increased to about 260 Gauss/cc.

In a modified embodiment, the sputter source 5 only can be used and the sputter source 4 of the Tb plate omitted. In this case, the sputter source 5 includes a target 8 of FeCo alloy plate having the aforementioned composition, that is, $Fe_{95-50}Co_{5-50}$ alloy plate containing 5–50 atomic % of cobalt.

FIG. 3 shows the measurements obtained of saturated intensity of magnetization Ms relative to varying concentrations of nitrogen gas in the Ar gas during the sputtering similar to the above. Curved lines 21 to 26 show the saturated intensity of magnetization relative to the concentrations of nitrogen gas in the Ar gas during sputtering with respect to each of the magnetic films $Fe_{95}Co_5$ (curve 21), $Fe_{90}Co_{10}$ (curve 22), $Fe_{80}Co_{20}$ (curve 23), $Fe_{70}Co_{30}$ (curve 24), $Fe_{50}Co_{50}$ (curve 25), and Fe alone (curve 26). For example, the saturated intensity of magnetization for $Fe_{95}Co_5$ in an atmosphere of Ar gas alone is only 1780 Gauss/cc while in an atmosphere of Ar gas containing 100 ppm nitrogen it is raised to 1860 Gauss/cc. As to $Fe_{90}Co_{10}$ produced in an atmosphere of Ar gas along, the Ms is only 1860 Gauss/cc while in a mixture of Ar gas and 1000 ppm nitrogen, it is increased to 1960 Gauss/cc. As will be apparent from the comparison of the curved line 26 with the curved lines 21 to 25, the saturated intensity of magnetixation Ms in the case of $Fe_{95-50}Co_{5-50}$ is greater than in the case of Fe only and a high intensity of magnetization is obtained in stable form in a wide range of contents of nitrogen gas from 10 to 10,000 ppm. This means that there is no criticality in the control of nitrogen gas in the Ar gas and accordingly it is possible to stably obtain a magnetic medium having good repeatability and superior characteristics in practical production of a magnetic film, that is, production of a magnetic medium, which contributes to important advantages.

Although the above-mentioned embodiment is applied to production of optomagnetic recording media having a magnetic film, the present invention may also be applied to production of other types of magnetic media formed of composite materials containing Fe.

Numerous modifications and variations of the disclosed invention will become apparent to those skilled in the art without departing from the scope and spirit of the invention as defined in the appended claims.

I claim as my invention:

1. A method for producing a magnetic medium comprising the steps of:
   sputtering a magnetic material consisting of Fe-Co alone or Tb-FeCo onto a substrate in an atmosphere of argon gas mixed with nitrogen gas in a sufficient amount to increase the saturation intensity of magnetization of said material and forming a magnetic film on said substrate while rotating said substrate.

2. A method according to claim 1 wherein said nitrogen is present in an amount of 10 to 10,000 ppm.

3. A method according to claim 1 wherein sputtering takes place from a plurality of targets, one of which is Tb.

4. A method according to claim 3 wherein one of said targets is FeCo alloy plate.

5. A method according to claim 4 wherein said FeCo alloy plate has the composition $Fe_{95-50}Co_{5-50}$.

6. A method according to claim 4 wherein said FeCo alloy plate has the composition $Fe_{95-70}Co_{5-30}$.

7. A method according to claim 1 wherein said atmosphere of argon is at a pressure of $10^{-2}$ to $10^{-3}$ Torr.

* * * * *